United States Patent
Campardo et al.

(10) Patent No.: US 7,027,317 B2
(45) Date of Patent: Apr. 11, 2006

(54) SEMICONDUCTOR MEMORY WITH EMBEDDED DRAM

(75) Inventors: Giovanni Campardo, Bergamo (IT); Rino Micheloni, Turante (IT)

(73) Assignee: STMicroelectronics, S.r.l., (IT)

( * ) Notice: Subject to any disclaimer, the term of this patent is extended or adjusted under 35 U.S.C. 154(b) by 92 days.

(21) Appl. No.: 10/720,013

(22) Filed: Nov. 20, 2003

(65) Prior Publication Data
US 2004/0136228 A1   Jul. 15, 2004

(30) Foreign Application Priority Data
Nov. 20, 2002   (IT) .......................... MI2002A2464

(51) Int. Cl.
*G11C 11/24*   (2006.01)
*G11C 14/00*   (2006.01)
(52) U.S. Cl. .................. 365/150; 365/149; 365/185.08
(58) Field of Classification Search ................ 365/150, 365/149, 185.08
See application file for complete search history.

(56) References Cited

U.S. PATENT DOCUMENTS

| | | | | |
|---|---|---|---|---|
| 4,760,556 A | * | 7/1988 | Deguchi et al. | 365/185.08 |
| 5,025,421 A | * | 6/1991 | Cho | 365/230.05 |
| 6,141,248 A | * | 10/2000 | Forbes et al. | 365/185.08 |
| 2002/0085423 A1 | * | 7/2002 | Tedrow et al. | 365/185.21 |

* cited by examiner

*Primary Examiner*—Richard Elms
*Assistant Examiner*—J. H. Hur
(74) *Attorney, Agent, or Firm*—Lisa K. Jorgenson; Graybeal Jackson Haley LLP

(57) ABSTRACT

A semiconductor memory comprises a plurality of memory cells, for example Flash memory cells, arranged in a plurality of lines, and a plurality of memory cell access signal lines, each one associated with at least one respective line of memory cells, for accessing the memory cells of the at least one respective line of memory cells; each signal line has a capacitance intrinsically associated therewith. A plurality of volatile memory cells is provided, each having a capacitive storage element. Each volatile memory cell is associated with a respective signal line, and the respective capacitive storage element formed by the capacitance intrinsically associated with the respective signal lines. In particular, the parasitic capacitances associated with bit lines of a matrix of memory cells can be exploited as capacitive storage elements.

26 Claims, 8 Drawing Sheets

SEMICONDUCTOR MEMORY WITH EMBEDDED DRAM

PRIORITY CLAIM

Figure 1:
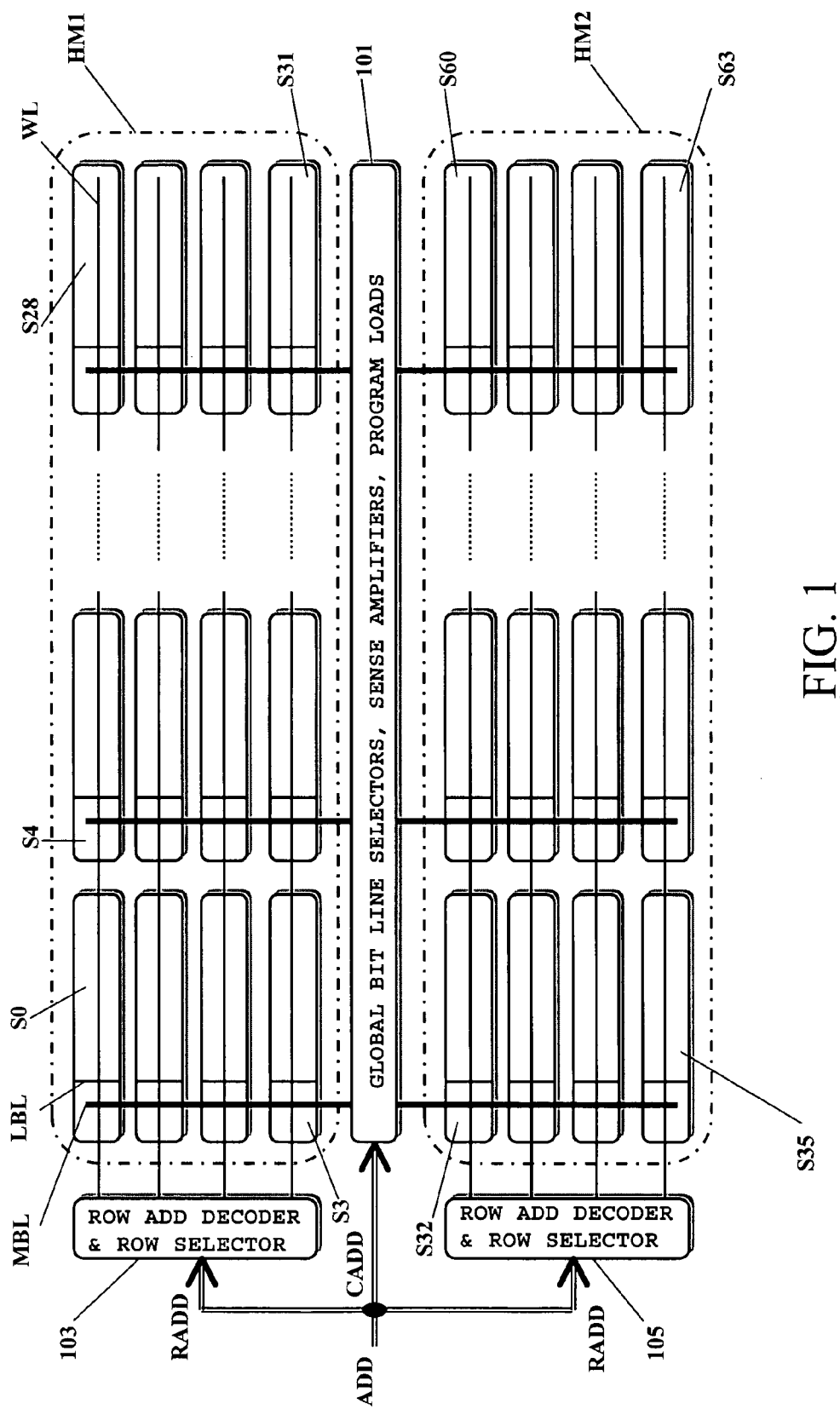

This application claims priority from Italian patent application No. MI2002A002464, filed Nov. 20, 2002, which is incorporated herein by reference.

TECHNICAL FIELD

The present invention generally relates to the field of semiconductor memories.

BACKGROUND

Semiconductor memories can be classified as volatile or non-volatile.

The family of volatile memories includes for example Static RAMs (SRAMs), Dynamic RAMs (DRAMs), and Pseudo-Static RAMs (PSRAMs). SRAMs are capable of operating at very high speeds, but are relatively expensive and power consuming; their main use is for fast-access, relatively small data storage areas (such as, for example, cache memories for data processors). DRAMs are significantly slower than SRAMs and require periodical data refreshes, but the compactness of their elemental memory cells allows integrating very large arrays of memory cells in a single semiconductor chip, and are therefore rather cheap; DRAMs are mainly used as large data storage areas where very fast access is not a primary goal. PSRAMs are substantially DRAMs with an embedded SRAM, operating as a cache for the most recently accessed DRAM locations.

The family of non-volatile memories includes mask ROMs, UV-erasable Electrically Programmable ROMs (EPROMs) and Electrically Erasable and Programmable ROMs, such as Flash memories and EEPROMs. In particular, Flash memories have become rather popular thanks to the possibility they offer of altering the data in a totally electrical way, and because large arrays of Flash memory cells can be integrated in a single semiconductor chip. Flash memories are typically exploited for storing data processor code and/or data.

In several applications there is the necessity of providing both volatile and non-volatile memories: the former allow to easily read and write data, but do not preserve the stored data when the power supply is removed; the latter are slower, especially as far as writing of data is concerned, but guarantee that the stored data do not get lost.

For example, when a Flash memory is provided to store a program for a microprocessor, it is preferable to have a volatile memory into which a piece of the program to be executed is stored; in this way, the fetching of the instructions by the microprocessor is faster, and data can be written in a time comparable with the read access time.

Attempts have been made to integrate in a same chip both a Flash memory and a volatile memory. However, it is difficult to devise a manufacturing process optimised for both the type of memories, and the chip size significantly increases.

SUMMARY

In view of the state of the art outlined above, an embodiment of the present invention provides a data storage semiconductor device or semiconductor memory in which a volatile memory is embedded, in particular a DRAM-like volatile memory, which was not affected by the problems discussed.

In particular, the Applicant has found that components intrinsically and unavoidably present in a semiconductor memory, for example in a Flash memory, and normally considered as parasitic components, can be expediently exploited to build a DRAM-like volatile memory, without the need of changing the standard manufacturing process of the semiconductor memory in which the volatile memory is embedded, and with a very limited overhead in terms of semiconductor area.

According to an aspect of the present invention, there is provided a semiconductor memory as set forth in appended claim 1.

Briefly stated, the semiconductor memory comprises a plurality of memory cells, arranged in a plurality of lines, and a plurality of memory cell access signal lines, each one associated with at least one respective line of memory cells, for accessing the memory cells of the at least one respective line of memory cells.

Each signal line has a capacitance intrinsically associated therewith, typically a parasitic capacitance.

A plurality of volatile memory cells is also provided, each having a capacitive storage element. Each volatile memory cell is associated with a respective one of said signal lines, and the respective capacitive storage element is formed by the capacitance intrinsically associated with the respective signal line.

Figure 2:
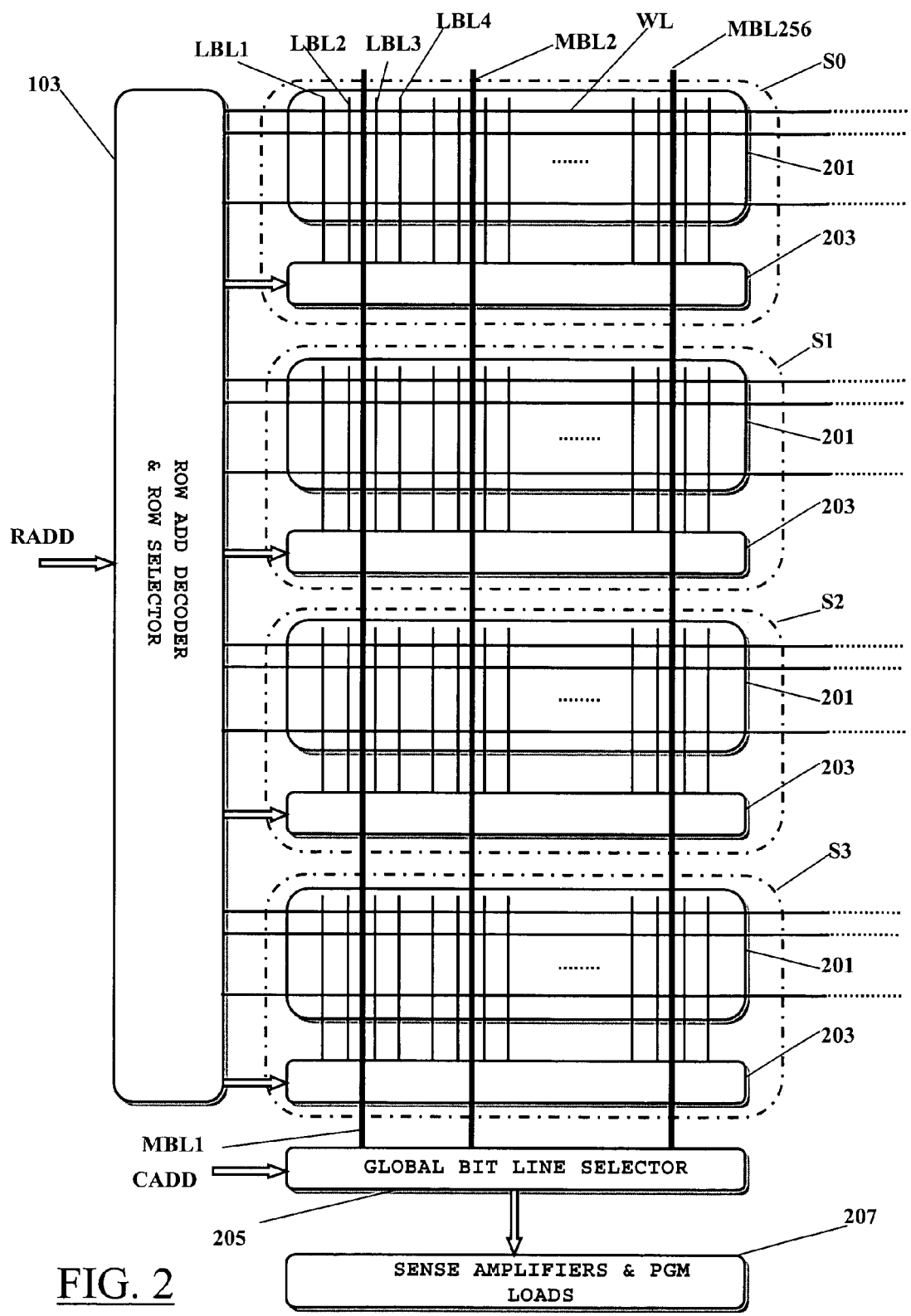
Figure 3A:
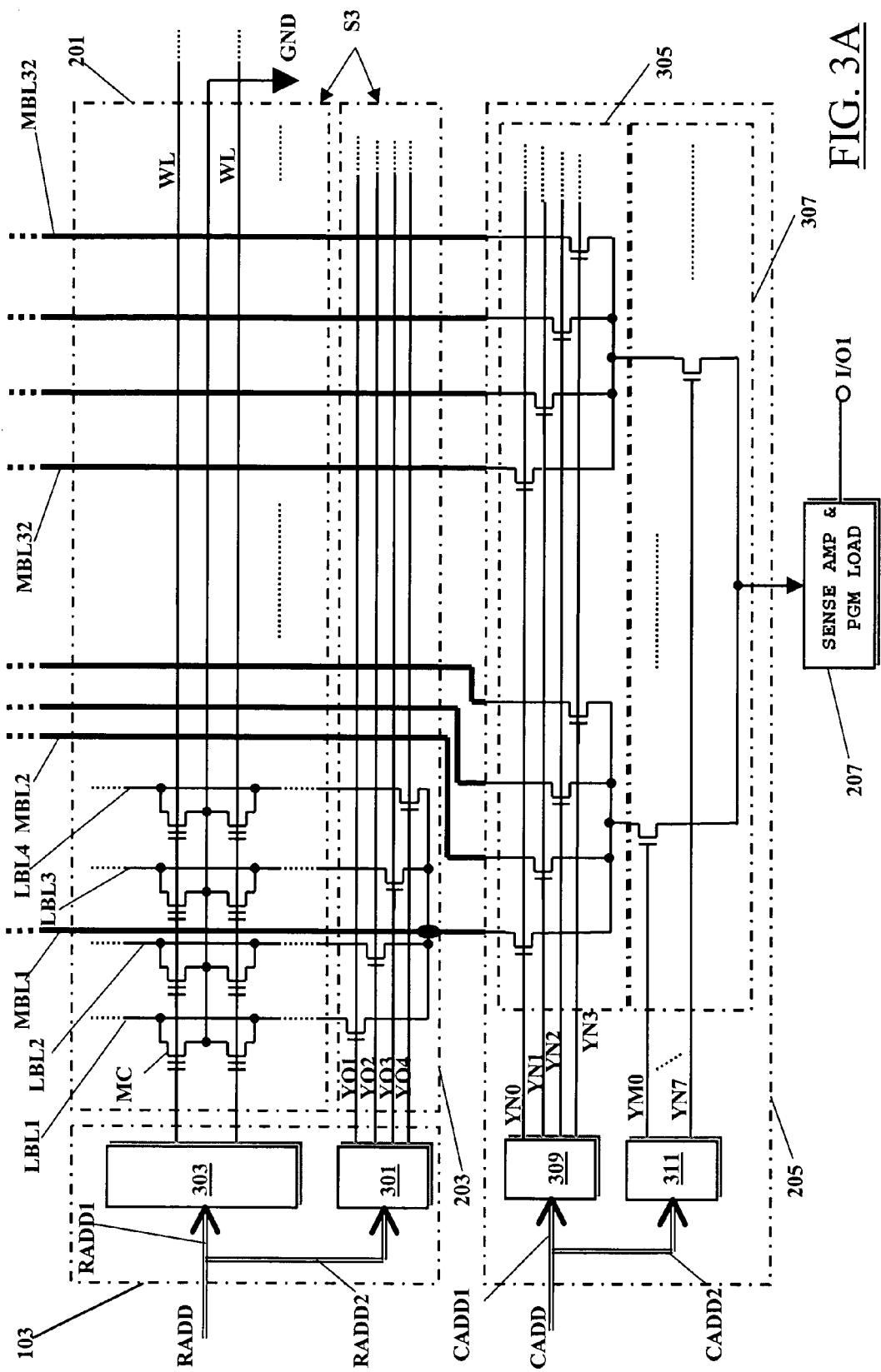
Figure 3B:
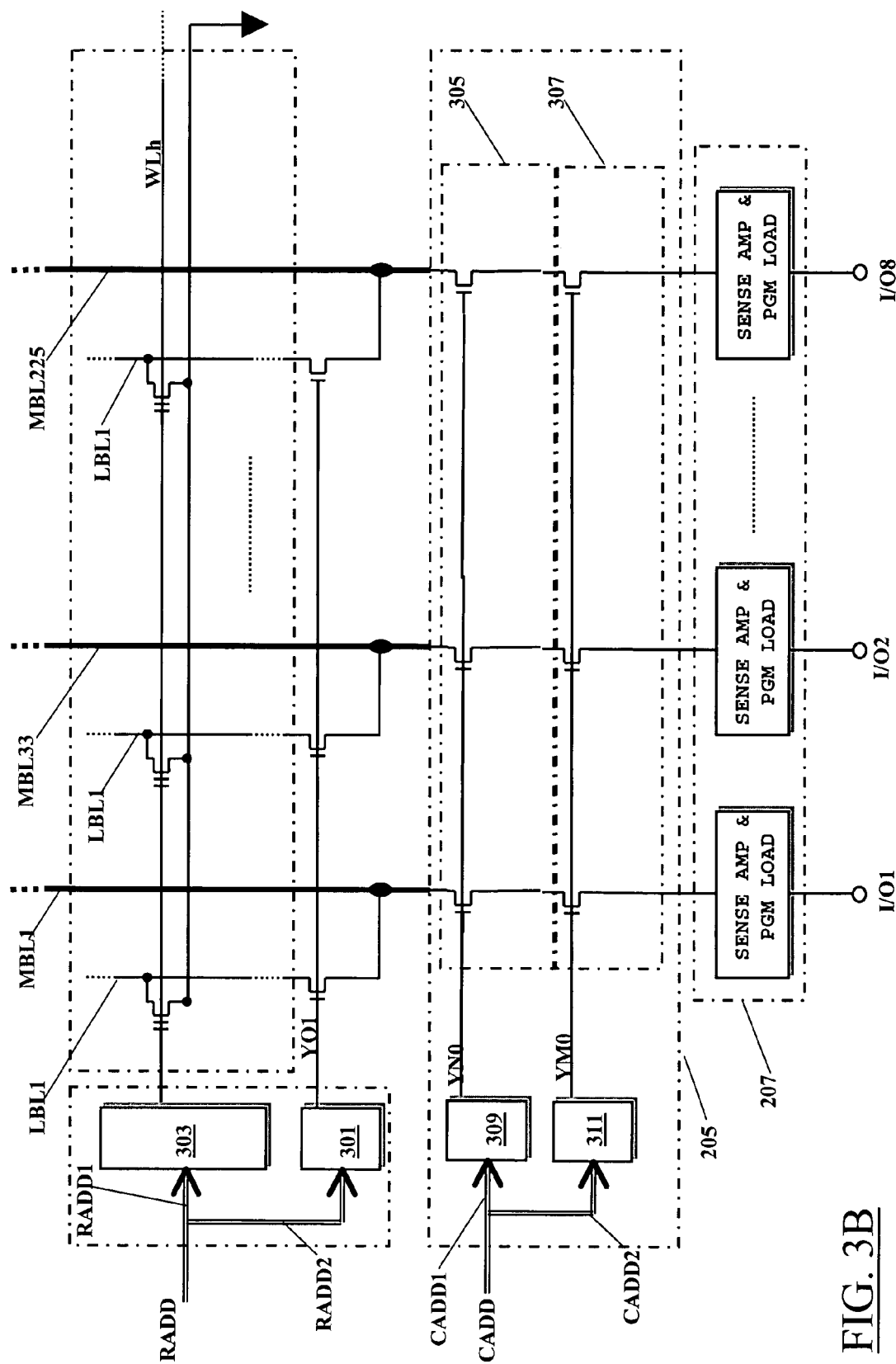
Figure 4A:
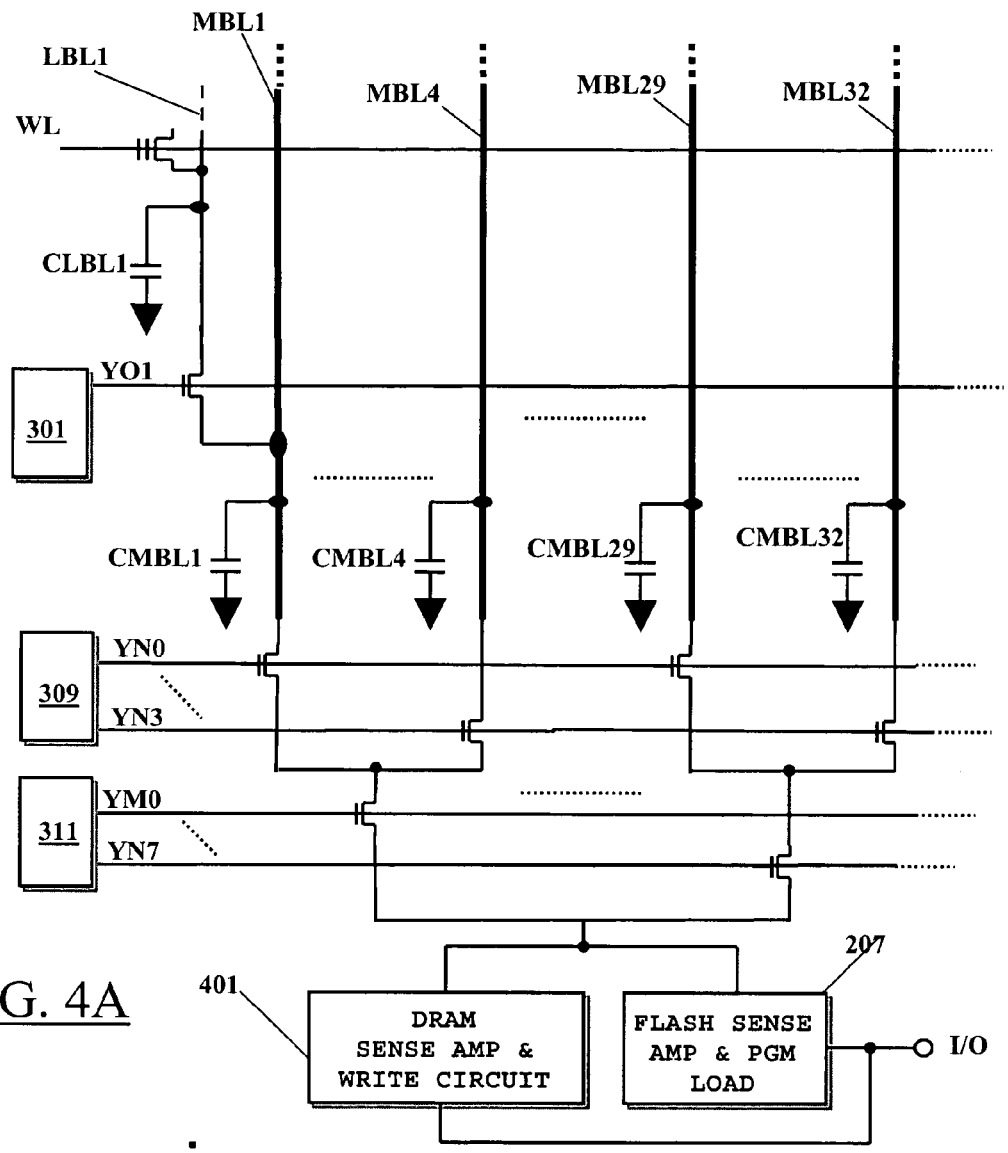
Figure 5:
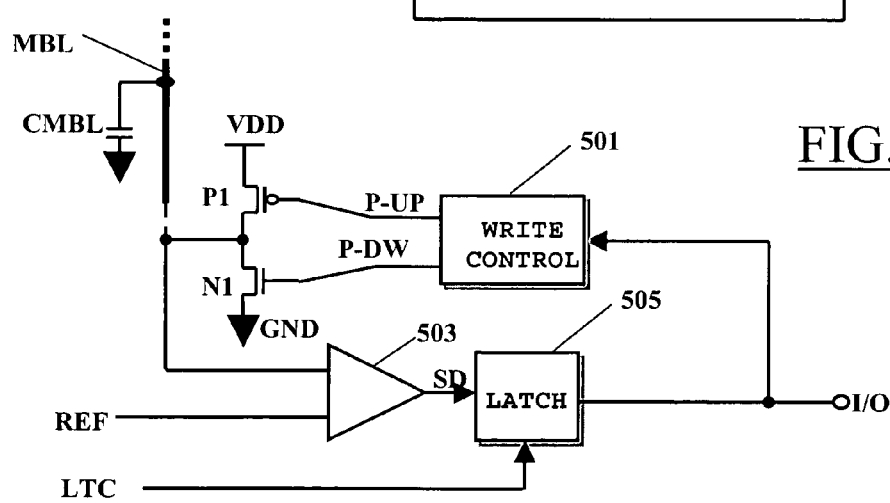
Figure 4B:
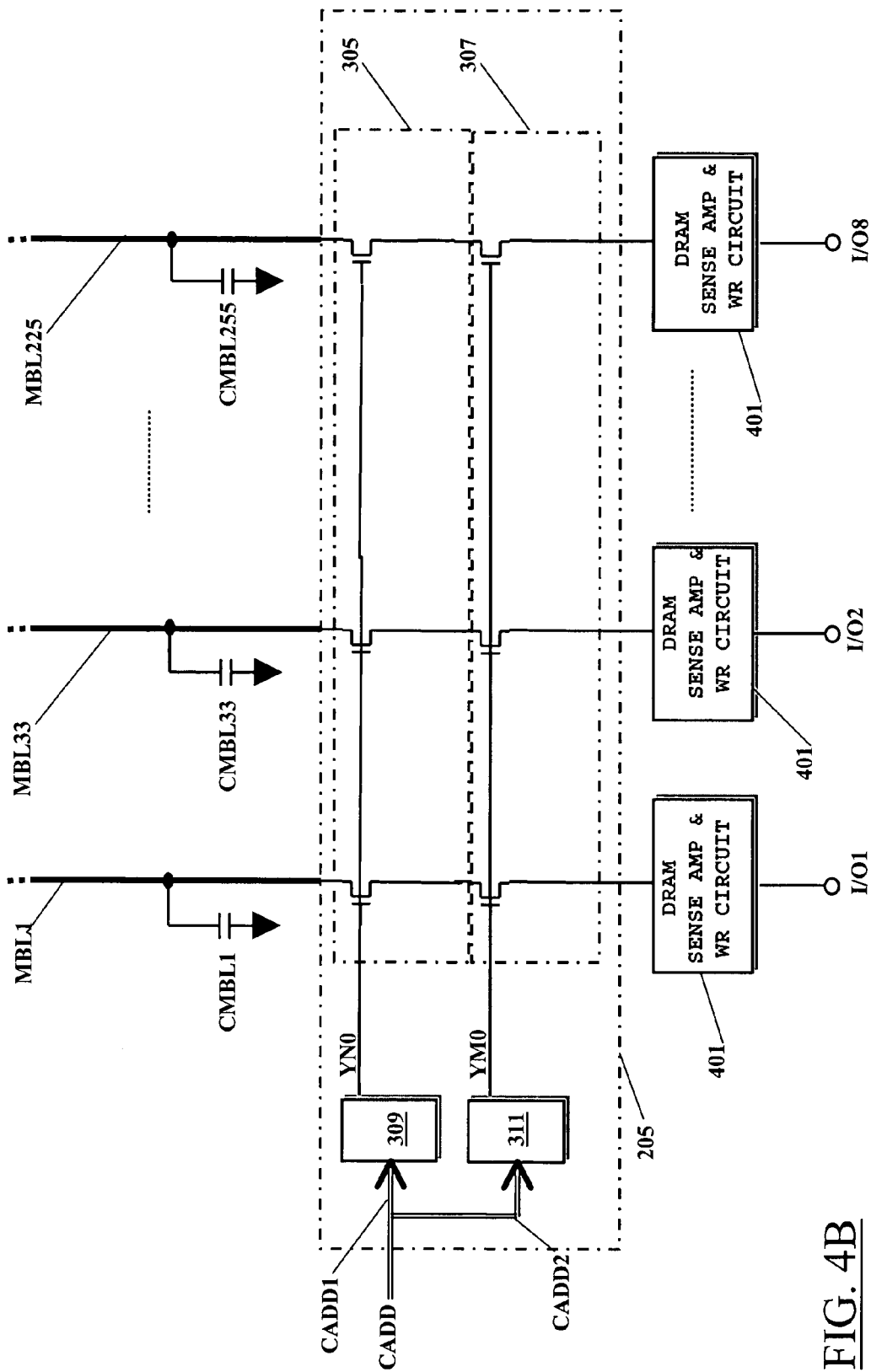
Figure 6:
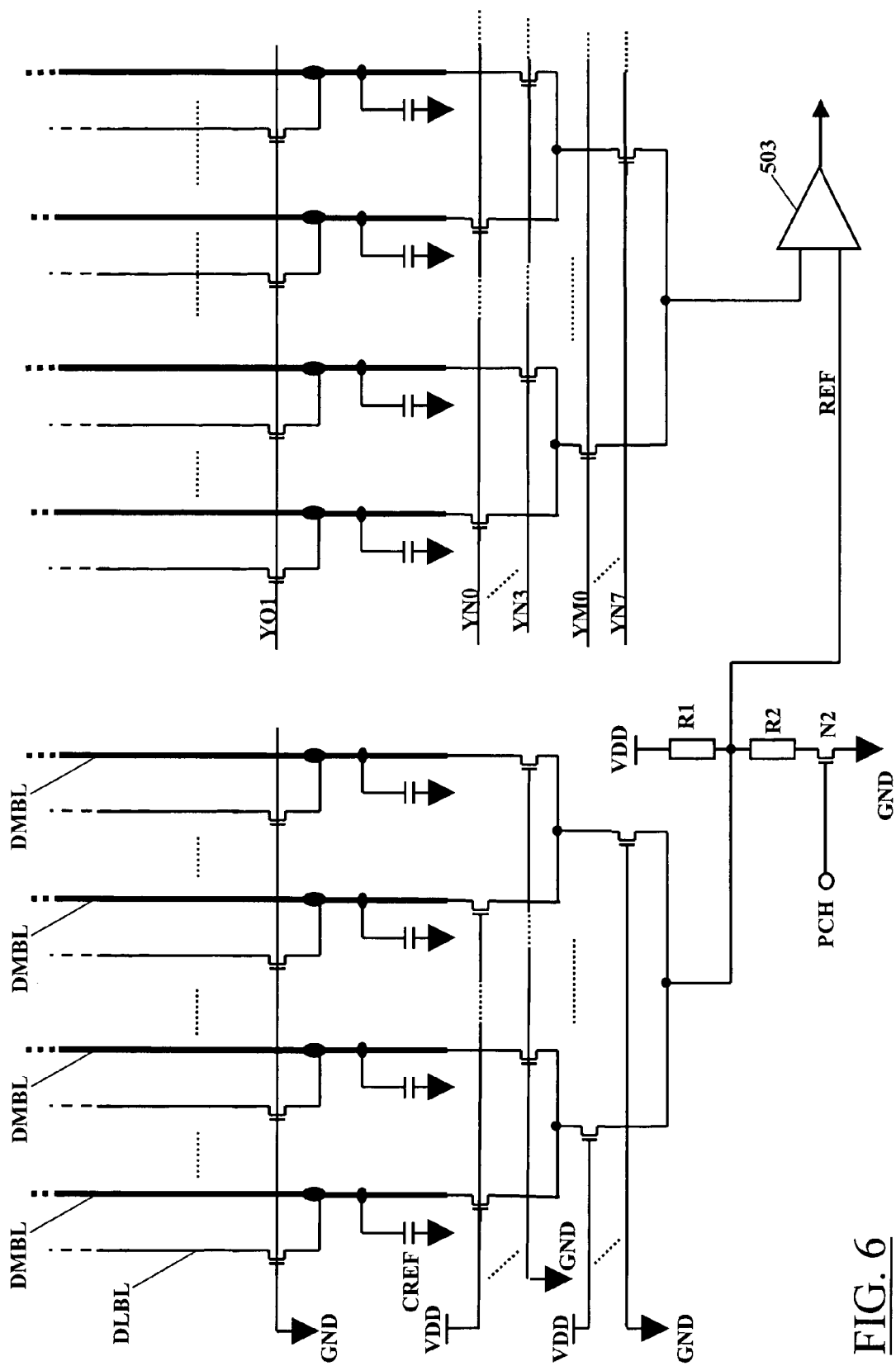
Figure 7:
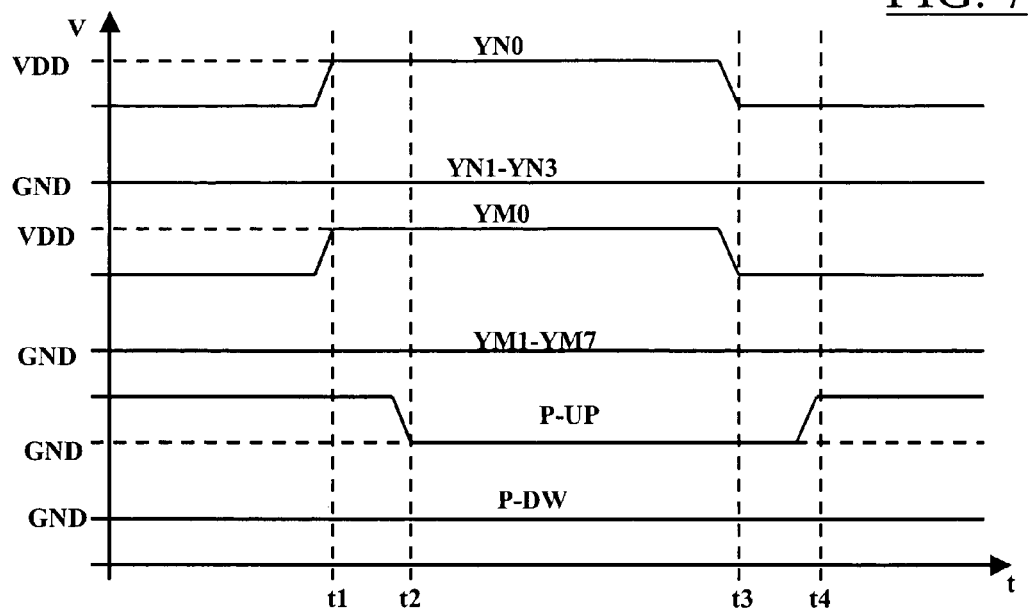
Figure 8:
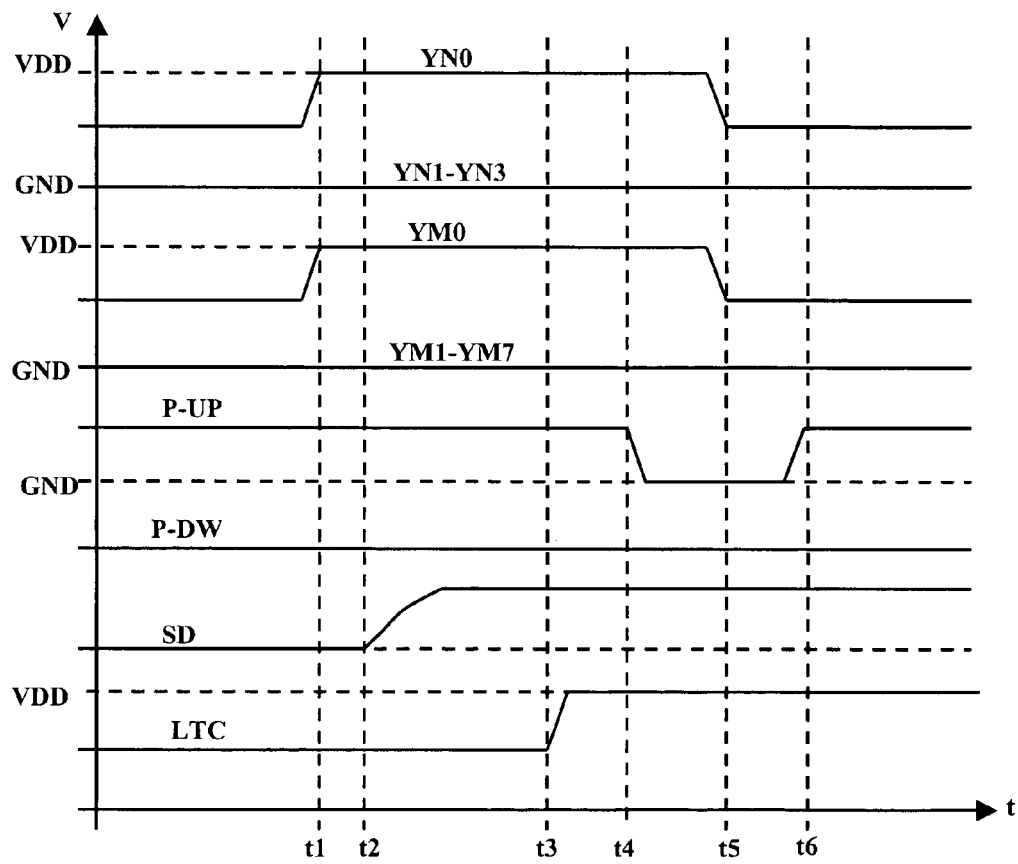

The features and advantages of the present invention will be made apparent by the following detailed description of an embodiment thereof, provided merely by way of non-limitative example with reference to the annexed drawings, wherein:

FIG. 1 schematically shows a memory according to an embodiment of the present invention, particularly a non-volatile memory and even more particularly a Flash memory, having a plurality of memory sectors;

FIG. 2 schematically shows in greater detail a portion of the memory of FIG. 1;

FIGS. 3A and 3B show in greater detail a column selection circuit arrangement for selecting columns of memory cells in a memory sector;

FIGS. 4A and 4B schematically show some memory cells of a volatile memory embedded in the Flash memory, and a schematic of a circuit for selecting the volatile memory cells, according to an embodiment of the present invention;

FIG. 5 schematically shows a circuit arrangement for reading and writing the volatile memory cells, according to an embodiment of the present invention;

FIG. 6 schematically shows one embodiment of a circuit arrangement for the generation of reference signals for reading the volatile memory cells;

FIG. 7 is a simplified timing diagram of a write operation conducted on the volatile memory; and FIG. 8 is a simplified time diagram of a read operation conducted on the volatile memory.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Referring to the drawings, a semiconductor memory according to an embodiment of the present invention is shown. In particular, the memory is a non-volatile memory and, even more particularly, a Flash memory, and comprises a matrix of Flash memory cells (hereinafter simply referred to as memory matrix), arranged by rows and columns.

In a way known per-se in the art, Flash memory cells are formed of MOS transistors having a drain, a source, a control gate and a charge-storage element, for example a conductive, electrically-isolated floating gate or a charge-trapping dielectric layer, typically comprising silicon nitride or the like. The Flash memory cells may be intended to store one bit or more bits each.

The Flash memory cells are grouped into a plurality of memory sectors. In particular, in the non-limitative example shown in the drawings, sixty-four memory sectors S0–S63 are provided, and the memory matrix layout is such as to define an upper half-matrix HM1 and a lower half-matrix HM2; each half-matrix includes thirty-two memory sectors, respectively the memory sectors S0–S31 in the upper half-matrix HM1, and the memory sectors S32–S63 in the lower half-matrix HM2.

In each half-matrix HM1, HM2, the respective memory sectors are arranged in rows and columns of memory sectors S0–S63, so as to define a two-dimensional array of memory sectors; in particular, in the shown embodiment, each row of memory sectors comprises eight memory sectors (e.g., the memory sectors S0, S4, . . . , S28 in the first row of the upper half matrix HM1), and each column of memory sectors comprises four memory sectors (e.g., the memory sectors S0–S3 in the first column of the upper half matrix HM1).

Typically, in a Flash memory the memory sectors S0–S63 are the elemental memory blocks that can be individually erased electrically.

Clearly, the layout of the memory matrix, the number of memory sectors, the size of the memory sectors S0–S63, depend on contingent circumstances, such as the memory size, the intended application and so on.

Each memory sector S0–S63 comprises a two-dimensional array 201 of Flash memory cells MC, arranged by memory cell rows and memory cell columns (hereinafter shortly referred to as rows and columns). In particular, in an exemplary and non-limitative embodiment of the invention, each memory sector comprises 1024 rows and 1024 columns, for a total of 220 memory cells; the memory includes in this case 64 mega memory cells.

Within each memory sector S0–S63, memory cells of a same column are connected to a same local bit line LBL, local to that memory sector. Each local bit line LBL of a memory sector is connectable to a respective global or main bit line MBL, which is common to all the memory sectors in a same column of memory sectors of the half-matrix (e.g., the first column of memory sectors S0–S3 in the upper half-matrix HM1). In particular, in an embodiment of the invention, each global bit line MBL is associated with a respective packet of local bit lines LBL in each memory sector S0–S63 of the column of memory sectors. For example, as visible in FIG. 2, the packet of local bit lines includes four local bit lines LBL1–LBL4 in each memory sector S0–S63 that are associated with a same global bit line MBL1, MBL2, . . . , MBL256; 256 global bit lines are thus provided for each column of memory sectors, both in the upper and in the lower half-matrices, for a total of 2048 global bit lines for the whole memory matrix.

From a manufacturing viewpoint, the local bit lines LBL are for example defined in a first metal layer, and the global bit lines are defined in a second, upper metal layer, isolated from the first metal layer and contacting the latter in the desired points.

As shown in FIGS. 2, 3A and 3B, each memory sector S0–S63 includes a local bit line selector 203, allowing to selectively connect one of the four local bit lines LBL1–LBL4 of each local bit line packet to the respective global bit line MBL1, MBL2, . . . , MBL256.

A global bit line selector 205 is provided, that allows selecting the global bit lines MBL. The global bit line selector 205 connects the selected global bit lines to sensing circuitry and to programming circuitry, schematically shown as a single block 207; conventionally, the sensing circuitry comprises sense amplifiers capable of sensing a current sunk by the memory cells, and the programming circuitry comprises program loads adapted to applying a programming voltage to the drains of the selected memory cells. In FIG. 1, a block 101 is intended to include the global bit line selectors 205, the sensing circuitry and the programming circuitry.

In each half matrix HM1 and HM2, word lines WL are provided which are common to all the memory sectors S0–S63 of a same row of memory sectors. Upper and lower word line selectors 103 and 105 allow selecting the word lines WL in the upper and, respectively, lower half-matrices.

The local bit line selectors 203, the global bit line selector 205 and the word line selectors 103 and 105 operate on the basis of address signals ADD; in particular, the local bit line selector 203 and the word line selector 103, 105 operate on the basis of a row address portion RADD of the address signals ADD, while the global bit line selector operates on the basis of a column address portion CADD of the address signals ADD. For any value of the address signals ADD, one of the memory sectors S0–S63 is selected and, within the selected memory sector, a group of memory cells forming a byte or a word are selected; such memory cells belong to a same word line (e.g., the word line WLh in FIG. 3B), and to different local bit lines LBL, belonging to local bit packets associated with different global bit lines MBL. The local bit lines LBL to which the selected memory cells belong are connected to the respective global bit lines MBL (e.g., the global bit lines MBL1, MBL33, . . . , MBL225 in FIG. 3B); the local bit line selectors 203 in the remaining memory sectors S0–S63 of the same memory sector column as the selected memory sector leave all the local bit lines LBL disconnected from the respective global bit lines MBL.

In particular, as visible in FIGS. 3A and 3B, the local bit line selector 203 comprises pass transistors driven by local bit line selection signals Y01–Y04, generated by a decoder 301, depicted as part of the word line selector 103, receiving a first subset RADD2 of the row addresses RADD; a second subset RADD2 of the row addresses RADD1 is instead fed to another decoder 303, selecting the word lines WL.

Also depicted in FIGS. 3A and 3B is a hierarchical, two-level structure of the global bit line selector 205. According to this two-level selection scheme, the global bit lines MBL in each column of memory sectors are grouped into groups each comprising a number of packets of, e.g., four global bit lines MBL. For example, if the memory has a byte-wide data word, eight groups of eight packets of global bit lines are provided. A first-level selector 305 allows selecting one global bit line MBL out of each packet of global bit lines. A second-level selector 307 allows selecting one among the eight packets of global bit lines in each group. The first- and the second-level selectors comprise pass transistors, driven by first-level and second-level selection signals YN0–YN4 and YM0–YM7, respectively, generated by two decoders 309 and 311 each fed with a respective portion of the column addresses CADD. As many first- and second-level selectors 305 and 307 are provided as the degree of parallelism of the memory. For example, if the memory data word is byte-wide, eight first- and second-level selectors 305 and 307 are provided, allowing to simultaneously selecting eight Flash memory cells in a memory sector and making them accessible through memory data input/output terminals I/01–I/08.

In order to select a memory cell within, e.g., the memory sector S3, the word line WL to which the memory cell belongs is selected by means of the word line selector 303, the local bit line to which the memory cell is connected is selected by means of the local bit line selector 203 and connected to the respective global bit line MBL; the global bit line to which the selected local bit line is associated is selected by the global bit line selector 205. The drain electrode of the selected memory cell is thus coupled to the sensing circuitry, for reading the memory cell, or to the programming circuitry, for writing the memory cell.

As schematically shown in FIGS. 4A and 4B, each global bit line MBL has intrinsically associated therewith a parasitic capacitance; for example, referring to FIG. 4A, capacitors CMBL1, CMBL4, CMBL29 and CMBL32 represent, in terms of lumped circuit elements, the parasitic capacitances associated with the global bit lines MBL1, MBL4, MBL29 and MBL32, respectively. The parasitic capacitance MBL associated with each global bit line LBL is the sum of several components, among which the junction capacitance of the transistors for the selection of the local bit lines associated with the global bit line, the capacitive coupling between the metal layer in which the global bit line is formed and the underlying/overlying layers of material, etc.

According to an embodiment of the present invention, the parasitic capacitances MBL associated with the global bit lines MBL are exploited as capacitive data storage elements, and thus as volatile memory cells, so as to embed a volatile memory in the Flash memory. More specifically, according to an embodiment of the present invention, the parasitic capacitance associated with a generic global bit line is exploited to form the capacitor of a DRAM-like memory cell. For example, the parasitic capacitances CMBL1, CMBL4, CMBL29 and CMBL32 depicted in FIG. 4A form four DRAM-like memory cells that can be exploited to store data in addition to those stored in the Flash cells.

Since the global bit line MBL decoding scheme is already designed to allow selecting specific global bit lines, according to the column addresses CADD, the DRAM-like memory cell associated with each global bit line can be selectively accessed through the same global bit line decoding scheme of the Flash memory. In particular, a generic one of the DRAM-like memory cells is accessed by selecting the global bit line MBL having associated therewith the parasitic capacitance forming the storage element of the DRAM-like memory cell. For example, the memory cell CMBL1 is accessed by asserting the signals YN0 and YM0, and keeping deasserted the other signals YN1–YN4 and YM1–YM7. In this way, the global bit line MBL1, and thus the free plate of the capacitance CMBL1, can be connected to a circuit block 401, intended to include a sense amplifier circuit adapted to sensing the DRAM-like memory cells, and a write circuit adapted to write the DRAM-like memory cells.

A DRAM memory can thus be embedded in the Flash memory, exploiting elements already present in the integrated circuit, such as the parasitic capacitances MBL that are inherently associated with the global bit lines MBL and the global bit line selector 205. This DRAM memory is thus in a sense "hidden" behind the Flash memory.

It is observed that the embedded DRAM has the same degree of parallelism as the Flash memory. This means that if the Flash memory is designed to allow access to a byte or a word within the Flash memory, the same holds true for the embedded DRAM. This is schematically shown in FIG. 4B.

In the embodiment discussed herein, a DRAM with 4096 memory cells is thus embedded in the Flash memory (256 DRAM cells for each column of memory sectors, 8 columns of memory sectors in each half-matrix).

FIG. 5 schematically shows an embodiment of the circuit block 401 in FIGS. 4A and 4B.

The DRAM cell write circuit comprises a voltage pull-up element and a voltage pull-down element, connected to the respective global bit line MBL; in particular, the voltage pull-up element comprises a P-channel MOSFET P1, and the voltage pull-down element comprises an N-channel MOSFET N1; the MOSFETs P1 and N1 are connected in series between a voltage supply line VDD (e.g., 5 V or 3 V) and a reference voltage line GND (the ground), and have drain electrodes connected to each other and to the respective global bit line MBL. A control circuit 501 controls the MOSFETs P1 and N1. The control circuit 501 receives the datum to be written from a respective data input/output terminal I/O of the memory (any one of the eight terminals I/01–I/08 of FIGS. 4A and 4B). The MOSFETs P1 and N1 are normally kept off, so that the write circuit is kept in a high output impedance condition. During a write operation, the control circuit 501 turns on one of the two MOSFETs P1 and N1, depending on the datum to be written into the DRAM memory cell: for example, if the datum to be written is a "0", the voltage pull-down MOSFET N1 is turned on, so as to discharge to ground the capacitance CMBL of the global bit line MBL; on the contrary, if the datum to be written is a "1", the voltage pull-up MOSFET P1 is turned on, so as to charge the capacitance CMBL to the supply voltage VDD.

The DRAM cell sensing circuit comprises a comparator 503, with an input connectable, through the global bit line selector 205, to a global bit line MBL specified by the column address portion CADD, and another input connected to a reference signal line REF. The comparator 503 feeds a latch 505 which is connected to the data input/output terminal I/O of the memory. The comparator 503 compares a signal that develops on the selected global bit line MBL with the reference signal, and provides an output logic state that is latched in the latch 505.

It is observed that the comparator 503 and the latch 505 can be part of the sensing circuitry already provided for reading the Flash memory cells, and can thus be shared, avoiding the need of providing dedicated circuits for the DRAM.

FIG. 6 shows a circuit arrangement according to an embodiment of the present invention for the generation of the reference signal REF used for sensing the DRAM. Specifically, a structure of dummy global bit lines DMBL is exploited; for the purposes of the present description, by dummy there is intended not actively exploited for storing information. For reasons of electrical matching, the dummy structure is structurally identical to the global bit line MBL structure to which any global bit line belongs; as mentioned previously, in the embodiment of the invention discussed herein, any global bit line MBL belongs to a global bit line structure comprising eight packets of four global bit lines each; thus, the dummy structure identically comprises a group of thirty-two dummy global bit lines, subdivided in eight packets of four dummy global bit lines. Still for reasons of electrical matching, dummy local bit lines DLBL of dummy Flash memory cells, and dummy local bit line selectors are provided; in particular, one such structure of dummy elements may be provided in each of the columns of memory sectors in the upper and lower half-matrices. The structure of dummy elements also includes a dummy global bit line selector structure, comprising a dummy first-level selector and a dummy second-level selector. The dummy first-level and second-level selectors are such that one dummy global bit line is always selected, while the other dummy global bit lines are always kept deselected, and are present only for reasons of electrical matching, for reproducing the effects that the unselected global bit lines have on the selected global bit line. The parasitic capacitance CREF associated with the selected dummy global line forms a reference DRAM-like cell.

Associated with the dummy global bit line structure is a pre-charge circuit for pre-charging the reference DRAM cell to a state intermediate between the states corresponding to the logic states "1" and "0". In the shown example, the pre-charge circuit comprises a voltage partition network, comprising for example two resistors R1, R2 connected in series between the supply voltage VDD and a the ground GND; a switch element, for example an N-channel MOSFET N2, is controlled by a pre-charge signal PCH and is turned on to enable the pre-charge of the DRAM reference cell to half the value of the supply voltage VDD (VDD/2). In particular, the pre-charge of the DRAM reference cell is performed before every read operation of the cells of the embedded DRAM. In this way, account is taken of the loss of charge due to the leakages. In case the datum stored in the DRAM cell to be sensed, is a "0", the loss of charge reduces the difference in voltage between the DRAM cell to be sensed and the DRAM reference cell, since the voltage across the capacitor of the latter tends to fall from VCC/2. In case the datum to be sensed is a "1", it is reasonably expected that both the DRAM cell to be sensed and the DRAM reference cell will undergo a substantially identical loss of charge, due to the fact that the dummy structure is substantially identical to the matrix one.

The operation of the memory will be now described making reference to the timing diagrams of FIGS. 7 and 8.

It is observed that the Flash memory and the DRAM are to be operated in a mutually exclusive way. When the Flash memory is accessed, the parasitic capacitances of the global bit lines are charged/discharged/left undisturbed depending on the Flash memory cells to be accessed and the data stored therein; therefore, at least some of the data stored in the DRAM get lost in consequence of an access to the Flash memory.

It is observed that this is not a major limitation: access to the Flash memory may take place from now and then, and the DRAM can be used as a temporary storage area of data in the time intervals between accesses to the Flash memory. For example, the Flash memory can be accessed to retrieve a portion of the data stored therein, for example a portion of code to be executed by a microprocessor; the retrieved code portion can be stored into the DRAM, and the code instructions be then fetched from the DRAM, instead that from the Flash memory.

Prior to accessing the DRAM for either writing or reading data, the access to the Flash memory cells is to be inhibited. This can for example be achieved simply by forcing all the local bit line selection signals YO1–YO4 of all the local bit line selectors 203 to a deasserted state, so that all the pass transistors of the local bit line selector are forced off. This ensures that the local bit lines LBL, and thus the drains of the Flash memory cells connected thereto, are isolated from the global bit lines LBL.

The operation of the hidden DRAM will be described referring first to a write operation, and then to a read operation.

Write Operation

Referring to FIG. 4A, let it be assumed that a datum is to be written into the DRAM cell having as storage element the capacitor CMBL1, i.e., the parasitic capacitance of the global bit line MBL1. Exploiting the column address signals and the global bit line selector 205 of the Flash memory, the global bit line MBL1 is selected. In the case herein discussed, the first-level selection signal YN0 is asserted, while the remaining first-level selection signals YN1–YN3 are kept de-asserted, and the second-level selection signal YM0 is asserted, while the remaining second-level selection signals YM1–YM7 are kept de-asserted.

It is observed that in order to avoid any sharing of charge between the parasitic capacitances associated with different global bit lines MBL, it is preferable that the assertion of the selection signals YN0 and YM0, leading to the selection of the desired global bit line MBL1, takes place only after all the other first and second level selection signals have been de-asserted, i.e., the selection signals YN0 and YM0 are asserted (FIG. 7, instant t1) starting from a condition in which all the first and second level selection signals are in a de-asserted state.

The writing circuit, initially kept in a high-impedance condition by the write control circuit 501 (MOSFETs P1 and N1 off), is enabled (instant t2). One of the MOSFETs P1 and N1 is turned on by the write control circuit 501, depending on the datum to be written, received at the data input/output terminal I/O of the memory. In particular, in order to write a "1", the voltage pull-up transistor P1 is turned on (signal P-UP asserted low), and the voltage pull-down transistor N1 is kept off (signal P-DW kept low): the capacitance CMBL1 is thus charged to the voltage supply VDD; in order to write a "0", the voltage pull-up transistor P1 is kept off, and the voltage pull-down transistor N1 is turned on: the capacitance CMBL1 is thus discharged to ground.

After a time sufficient for the capacitance CMBL1 to charge up to the supply voltage VDD or to discharge to ground, the first and second level selection signals YN0 and YM0 are de-asserted (instant t3), so that the global bit line MBL1 is isolated, and then the writing circuit is returned to the high-impedance condition (instant t4).

It is pointed out that all the operations previously described are carried out in parallel on all the DRAM cells making up the byte or word of the DRAM, which in the present embodiment has the same size as the data word of the Flash memory.

Read Operation

Let it be assumed again that the DRAM cell having the storage capacitor formed by the parasitic capacitance CMBL1, associated with the global bit line MBL1, is to be accessed, this time to read the datum stored therein.

As in the case of the write operation, the global bit line MBL1 is selected: the first-level decoding signal YN0 is asserted, while the remaining first-level selection signals YN1–YN3 are kept de-asserted, and the second-level selection signal YM0 is asserted, while the remaining second-level selection signals YM1–YM7 are kept de-asserted. Also in this case, in order to avoid any sharing of charge between the parasitic capacitances associated with different global bit lines MBL, it is preferable that the selection signals YN0 and YM0 are asserted (FIG. 8, instant t1) starting from a condition in which all the first and second level selection signals are de-asserted.

The charge stored in capacitance CMBL1 is then sensed (instant t2). The selected global bit line MBL1 is coupled to an input terminal of the comparator 503, receiving at the other input terminal the reference signal REF generated in the present example by the structure depicted in FIG. 6; it is pointed out that the pre-charge operation of the reference cell precedes the read operation herein described. The sensing phase ends (instant t3) after a time sufficient for the output SD of the comparator 503 to settle. The sensed datum is thus available at the output of the comparator 503.

As in any DRAM, the read operation of a DRAM cell destroys the stored datum: charge sharing effects due to the inevitable presence of parasitic elements cause in fact the charge stored in the capacitance CMBL1 to be lost during the read. It is thus necessary to write the datum back into the accessed DRAM cell. To this purpose, the datum, present at the output of the comparator 503, is latched into the latch 505 upon assertion of the signal LTC, instant t3, and a write operation similar to the one described above is carried out. The latched datum is fed back to the write control circuit 501; the writing circuit, so far kept disabled, is enabled, and the voltage pull-up and pull-down transistors P1, N1 are turned on/off (signals P-UP and P-DW asserted or kept de-asserted, time interval t4–t6) depending on the datum to be rewritten.

Conventional DRAMs need to be periodically refreshed, so that the stored data are not lost due to current leakages.

In the present case, it is observed that the parasitic capacitances CMBL exploited as DRAM storage capacitors are substantially heavier than the tiny capacitances normally used for fabricating large DRAM cell arrays. Parasitic capacitances of the order of 1 pF can be typical which, in view of the expected leakage currents, have relatively long discharge times (of the order of some milliseconds). Thus, data refresh schemes could be avoided.

Data refreshing schemes can however be implemented in order to periodically refresh the data stored in the DRAM cells, thereby ensuring that the stored data are not lost due to leakages. In particular, the data refresh operation may be entrusted to the user of the memory, as in conventional DRAMs: the DRAM is periodically accessed in reading, so that the stored information is automatically written back into the DRAM cells. Alternatively, internal self-refresh circuits can be provided in the memory, for autonomously conducting the data refresh of the DRAM.

In the embodiment of the invention described herein, the parasitic capacitances CMBL associated with the global bit lines MBL are exploited to form capacitive data storage elements. It is however observed that not only the global bit lines MBL, but also the local bit lines LBL have parasitic capacitances intrinsically associated therewith. For example, in FIG. 4A the lumped circuit element CLBL1 denotes the parasitic capacitance associated with the local bit line LBL1 in the memory sector S3.

The Applicant has observed that also the parasitic capacitances CLBL associated with the local bit lines LBL can be exploited as capacitive storage elements of DRAM-like memory cells, in the same way as the parasitic capacitances CMBL associated with the global bit lines MBL are exploited. In this case, in order to access a specific DRAM-like memory cell, it is also necessary to exploit the local bit line selectors 203.

Exploiting the parasitic capacitances CLBL inherently associated with the local bit lines LBL, instead of the parasitic capacitances CMBL associated with the global bit lines LBL, allows obtaining, without any overhead in semiconductor area, a DRAM-like memory that is, in the present example, four times larger than the DRAM-like memory that could be obtained using the parasitic capacitances associated with the global bit lines.

However, the Applicant has observed that exploiting the parasitic capacitances CLBL associated with the local bit lines LBL does not allow leaving the Flash memory cells undisturbed when using the DRAM-like memory. In fact, as can be seen from FIG. 4, the charging/discharging of the capacitance CLBL1 may cause an electrical stress on the Flash memory cells having drains connected to the local bit line LBL1.

On the contrary, exploiting the parasitic capacitances CMBL associated with the global bit lines MBL, it is possible to operate on the DRAM-like memory without disturbing the Flash memory; in fact, when operating on the DRAM-like memory, the local bit line selectors 203 can be kept disabled, so that the local bit lines LBL are disconnected from the respective global bit lines MBL.

In any case, if one accepts to have the Flash memory cells slightly stressed during the operation of DRAM-like memory, the use of the parasitic capacitances CLBL associated with the local bit lines LBL allows obtaining a rather large DRAM-like memory.

Concerning the size of the embedded DRAM, in the embodiment discussed herein, one DRAM cell is associated to each global bit line MBL; a DRAM with 4096 memory cells is thus embedded in the Flash memory (256 DRAM cells for each column of memory sectors, 8 columns of memory sectors in each half-matrix).

Alternative embodiments allow increasing the size of the DRAM embedded in the Flash memory.

For example, the global bit lines MBL may be segmented: each global bit line may be segmented in two or more global bit line segments. When the Flash memory needs to be accessed, the different segments of a same global bit line MBL are connected to each other to form a single global bit line; on the contrary, the different global bit line segments are kept separated from each other when the DRAM needs to be accessed. Switch elements, for example pass transistors, are suitable for enabling this global bit line segmentation. In this way, exploiting the parasitic capacitance associated with each global bit line segment, the number of DRAM cells is increased. Clearly, in order to selectively access the different global bit line segments, the global bit line selector 205 needs to be expanded.

Alternatively, the number of global bit lines MBL in the shown example, one every four local bit lines) can be doubled.

In particular, the number of global bit lines MBL may be increased by providing dummy global bit lines DMBL, which are left floating when the Flash memory is accessed; it is observed that such dummy global bit lines might be expediently exploited also by the Flash memory, which could use them for associating with the reference cells necessary for sensing the Flash memory cells the parasitic capacitances required for matching the Flash memory cells to be sensed.

The size of the DRAM may be further increased adopting a multi-level approach similar to that already adopted in some non-volatile memories, e.g. Flash memories. For example, the DRAM-like cell storage capacitors can be charged to four distinct voltage levels, e.g. the ground, the supply voltage, and two further levels intermediate between the ground and the supply voltage. Assuming by way of example a supply voltage VDD of 3 V, the DRAM-like cell storage capacitor may be charged to 0 V, 1 V, 2 V and 3 V. In this way, each DRAM cell is capable of storing two bits, and the DRAM size is doubled. The multi-level approach is difficult to be implemented in conventional DRAMs, wherein the storage capacitors are tiny and charge-sharing effects prevent from discriminating between slightly different charge voltages. In the present case the DRAM cell storage capacitor is instead relatively large and less affected by charge-sharing effects.

In case the multi-level DRAM is embedded in a multi-level Flash memory, the same sensing circuits provided for reading the multi-level Flash memory cells can be exploited for reading the multi-level DRAM cells.

The embedded DRAM architecture can be advantageously exploited in dual-bank Flash memories: in this case, one Flash memory bank and the DRAM embedded in the other Flash memory bank can operate simultaneously. The DRAM can be used as a memory buffer (for example, a write memory buffer storing data to be written into the other Flash memory bank), or as a shadow memory.

The present invention has been herein described by way of some embodiments in connection with a Flash memory. Those skilled in the art will readily recognize that the invention can actually be applied to other types of memories, either non-volatile or volatile. For example, exploiting the parasitic capacitance of the bit lines, the invention can be exploited in a DRAM, to create an embedded, secondary memory, or in a SRAM, in a mask ROM, in an EPROM, in an EEPROM. The invention can be applied in general whenever a matrix structure is present.

The described embodiment of a Flash memory and other types of memory including the described embodiments an embedded DRAM may be utilized in a variety of different types of electronic systems, such as a computer system.

The invention claimed is:

1. A semiconductor memory comprising:
a plurality of memory cells, arranged in a plurality of lines;
a plurality of memory cell access signal lines, each one associated with at least one respective line of memory cells, for accessing the memory cells of the at least one respective line of memory cells, each signal line having a capacitance intrinsically associated therewith;
a plurality of volatile memory cells, each volatile memory cell having a capacitive storage element,
each volatile memory cell being associated with a respective access signal line, the capacitive storage element of each volatile memory cell including the capacitance intrinsically associated with the respective access signal line; and
a circuit for writing data into the volatile memory cells.

2. The semiconductor memory according to claim 1, in which said capacitance is a parasitic capacitance intrinsically associated with the signal line.

3. The semiconductor memory according to claim 1 or 2, further comprising:
a signal line selector adapted to selecting the signal lines for accessing the memory cells, and
a volatile memory cell selector for selecting the volatile memory cells,
the volatile memory cell selector comprising the signal line selector.

4. The semiconductor memory according to claim 3, in which said plurality of lines into which the plurality of memory cells are arranged correspond to bit lines of the memory.

5. The semiconductor memory according to claim 4, in which said signal lines are global bit lines and said bit lines are local bit lines of the memory, each global bit line being associated with at least two local bit lines, and comprising a local bit line selector for selectively connecting the local bit lines to the respective global bit line.

6. The semiconductor memory according to claim 5, in which said memory cells are arranged to form at least two memory sectors, the plurality of local bit lines associated with any global bit line comprising at least one local bit line in each of the at least two memory sectors.

7. The semiconductor memory according to claim 6, in which the local bit line selector keeps the local bit lines disconnected from the respective global bit line when accessing the volatile memory cells.

8. The semiconductor memory according to claim 1, in which the circuit for writing data into the volatile memory cells comprises a charging/discharging circuit for charging or discharging the capacitive storage elements, depending on the data to be written.

9. The semiconductor memory according to claim 1, comprising a circuit for sensing data stored in the volatile memory cells.

10. The semiconductor memory according to claim 9, in which the circuit for sensing data stored in the volatile memory cells comprises a circuit for rewriting the sensed data into the volatile memory cells.

11. The semiconductor memory according to claim 10, in which the circuit for rewriting data comprises the circuit for writing data.

12. The semiconductor memory of claim 1, in which said memory cells are non-volatile memory cells.

13. A method of storing data, comprising:
providing a plurality of memory cells, arranged in a plurality of lines;
providing a plurality of semiconductor memory cell access signal lines, each one associated with at least one respective line of memory cells, for accessing the memory cells of the at least one respective line of memory cells;
using the memory cells for storing first data;
characterised by further comprising:
using capacitances intrinsically associated with the memory cell access signal lines as capacitive storage elements, and
using the capacitive storage element for volatily storing second data.

14. A memory, comprising:
a plurality of bit lines;
a plurality of memory cells, each memory cell being selectively couplable to an associated bit line;
read-write circuitry coupled to the bit lines and operable in a first read mode to couple a selected memory cell to the associated bit line and to sense the bit line to detect the data stored in the selected memory cell and operable in a first write mode to couple a selected memory cell to the associated bit line and transfer data into the selected memory cell, and operable in a second read mode to select a bit line and isolate all memory cells from the selected bit line, and to sense the bit line to detect data stored on the selected bit line, and operable in a second write mode to select a bit line and isolate all memory cells from the selected bit line, and to transfer data into the selected bit line.

15. The memory of claim 14 wherein the memory cells comprise Flash memory cells and wherein memory cells including the selected bit lines comprise DRAM-like memory cells, with each bit line having an intrinsic capacitance that functions to store charge corresponding to data.

16. The memory of claim 14 wherein the memory cells are arranged in rows and columns and are grouped to form a first bank of memory cells and a second bank of memory cells.

17. The memory of claim 16 wherein the read-write circuitry is operable in the first read and write modes to access memory cells in the first bank and operable at the same time in the second read and write modes to access memory cells in the second bank, and vice versa.

18. The memory of claim 14 further comprising a plurality of main bit lines, the number of main bit lines being fewer than the number of bit lines, and wherein the read-write circuitry is further operable to selectively couple bit lines to the main bit lines during the first read and write modes and wherein the selected bit lines in the second read and write modes correspond to the main bit lines.

19. The memory of claim 14 wherein the read-write circuitry comprises:
row address decoders coupled through word lines to the memory cells;
column address decoders;
sensing amplifiers selectively couplable to the bit lines; and
write control circuitry selectively couplable to the bit lines.

20. A method of storing data in a memory-cell array, the memory-cell array including a plurality of memory cells and a plurality of bit lines, each memory cell being selectively couplable to an associated bit line, and the method comprising:
storing data in the memory cells in the array; and
storing data on the bit lines of the array.

21. The method of claim 20 further comprising:
selecting a memory cell in the array;
coupling the selected memory cell to the associated bit line;
reading data from or writing data to the selected memory cell over the bit line;
selecting a bit line;
isolating all memory cells from the selected bit line; and
reading data from or writing data onto the selected bit line.

22. The method of claim 20 wherein the memory-cell array comprises a first array and a second array, and wherein storing data in the memory cells comprises storing data in memory cells in one of the first and second arrays and wherein storing data on the bit lines of the arrays comprises storing data on the bit lines of the other one of the first and second arrays.

23. The method of claim 20 wherein storing data on the bit lines of the array comprises storing data on main bit lines of the array, each main bit line being couplable to a group of the plurality of the bit lines.

24. An electronic system, comprising:
a memory, including,
a plurality of bit lines;
a plurality of memory cells, each memory cell being selectively couplable to an associated bit line;
read-write circuitry coupled to the bit lines and operable in a first read mode to couple a selected memory cell to the associated bit line and to sense the bit line to detect the data stored in the selected memory cell and operable in a first write mode to couple a selected memory cell to the associated bit line and transfer data into the selected memory cell, and operable in a second read mode to select a bit line and isolate all memory cells from the selected bit line, and to sense the bit line to detect data stored on the selected bit line, and operable in a second write mode to select a bit line and isolate all memory cells from the selected bit line, and to transfer data into the selected bit line.

25. The electronic system of claim 24 wherein the electronic system comprises a computer system.

26. The electronic system of claim 24 wherein the memory cells comprise Flash memory cells.

* * * * *